United States Patent

Hyozo et al.

Patent Number: 5,894,172
Date of Patent: Apr. 13, 1999

[54] SEMICONDUCTOR DEVICE WITH IDENTIFICATION FUNCTION

[75] Inventors: Masahiko Hyozo; Toshiyuki Tsujii; Tetsuo Tada; Hiroshi Noda; Ryouichi Takagi; Mikio Asai, all of Toyko, Japan

[73] Assignee: Mitsubishi Denki Kabushiki Kaisha, Tokyo, Japan

[21] Appl. No.: 08/745,273

[22] Filed: Nov. 8, 1996

[30] Foreign Application Priority Data

May 27, 1996 [JP] Japan ................. 8-131599

[51] Int. Cl.$^6$ ................. H01L 31/0203; H01L 23/04; H01L 23/544
[52] U.S. Cl. ................. 257/797; 257/433; 257/730; 382/8
[58] Field of Search ................. 257/797, 433, 257/730; 382/8

[56] References Cited

U.S. PATENT DOCUMENTS

| | | | |
|---|---|---|---|
| 4,027,246 | 5/1977 | Caccoma et al. | 235/151.1 |
| 4,095,095 | 6/1978 | Muraoka et al. | 235/419 |
| 4,419,747 | 12/1983 | Jordan | 365/201 |
| 4,825,093 | 4/1989 | Kiriseko et al. | 250/566 |
| 4,962,423 | 10/1990 | Yamada et al. | 358/101 |
| 5,175,774 | 12/1992 | Traux et al. | 382/8 |
| 5,463,459 | 10/1995 | Morioka et al. | 256/237 |
| 5,475,268 | 12/1995 | Kawagoe et al. | 257/797 |
| 5,557,411 | 9/1996 | Houryu et al. | 356/401 |
| 5,560,775 | 10/1996 | Conboy et al. | 118/500 |
| 5,651,798 | 7/1997 | Conboy et al. | 29/25.01 |

FOREIGN PATENT DOCUMENTS

| | | |
|---|---|---|
| 61-196512 | 8/1986 | Japan. |
| 63-313812 | 12/1988 | Japan. |
| 1-318249 | 12/1989 | Japan. |
| 2-278809 | 11/1990 | Japan. |
| 3-256314 | 11/1991 | Japan. |

*Primary Examiner*—Teresa M. Arroyo
*Attorney, Agent, or Firm*—Oblon, Spivak, McClelland, Maier & Neustadt, P.C.

[57] ABSTRACT

A bare chip (1) is rectangular, and has a front surface (1a) on the center of which semiconductor elements are integrated and a back surface. Notches (2) are formed on a side of the bare chip (1) according to the kind of the semiconductor elements integrated on the bare chip (1). The notches (2) are oblong and extend through the bare chip (1) from the front surface (1a) to the back surface. For example, assuming that the notch (2) represents "1" and a portion without the notch (2) represents "0", one-bit information is obtained according to the presence or absence of the notch (2). When detection of several portions is made, binary information according to a detection result, i.e., information regarding the type of the bare chip (1), is obtained. For detection of the presence or absence of the notch (2), the bare chip (1) is irradiated with light, and then whether the light goes through the notch (2) or is intercepted by the bare chip (1) is detected. Thus, a semiconductor device which allows easy identification of its type is provided.

2 Claims, 11 Drawing Sheets

1111(2)=>F
0001(2)=>1
0111(2)=>7
0010(2)=>2

SEMICONDUCTOR DEVICE WITH IDENTIFICATION FUNCTION

BACKGROUND OF THE INVENTION

1. Field of the Invention

The present invention relates to a construction of a semiconductor device (LSI), which is effective in identifying the type name of itself.

2. Description of the Background Art

For multi-chip-module, it is now expected that shipments of unpacked LSI, i.e., bare chip, will increase in the future. There arises a need for screening of bare chips in order to select a required type of bare chip among a plurality of types of bare chips.

FIG. 33 is a plan view of a background-art bare chip 1. On a surface of the background-art bare chip 1, a type name 8 represented by characters is printed. The type of bare chip 1 is identified by the type name 8.

The background art disadvantageously needs a special device for locating and recognizing the type name 8. Furthermore, until now, no standard has been established as to where the type name 8 should be printed in the bare chip 1, and therefore it is very difficult to locate the type name 8.

SUMMARY OF THE INVENTION

The present invention is directed to a semiconductor device with identification function. According to a first aspect of the present invention, the semiconductor device with identification function comprises: a first main surface, on the center portion of which semiconductor elements are integrated; and a second main surface. The semiconductor device is formed by division of a semiconductor wafer, and the type of the semiconductor device is identified by information corresponding to the semiconductor elements. In the semiconductor device with identification function of the first aspect, at least one mark is selectively provided on at least one of a peripheral portion of the first main surface and the second main surface according to the information, the at least one mark makes a state of light reflection different from that on a portion without the mark when the semiconductor device is irradiated with light, to provide two kinds of states which are different from each other and correspond to binary-logic, and the information is obtained by selective combination of the two kinds of states.

According to a second aspect of the present invention, the semiconductor device with identification function comprises: a buffer provided in its peripheral portion, having a first main surface and a second main surface. The type of the semiconductor device is identified by information corresponding to semiconductor elements integrated on the semiconductor device. In the semiconductor device with identification function of the second aspect, at least one mark is selectively provided on at least one of the first main surface and the second main surface according to the information, the at least one mark makes a state of light reflection different from that on a portion without the mark when the buffer is irradiated with light, to provide two kinds of states which are different from each other and correspond to binary logic, and the information is obtained by selective combination of the two kinds of states.

According to a third aspect of the present invention, in the semiconductor device with identification function of the first aspect, a position mark is provided to indicate where the at least one mark is provided in the semiconductor device.

According to a fourth aspect of the present invention, in the semiconductor device with identification function of the second aspect, a position mark is provided to indicate where the at least one mark is provided in the buffer.

According to a fifth aspect of the present invention, in the semiconductor device with identification function of the first or third aspect, the at least one mark is at least one notch provided in a contour portion of the semiconductor device, extending through the semiconductor device from the first main surface to the second main surface.

According to a sixth aspect of the present invention, in the semiconductor device with identification function of the second of fourth aspect, the at least one mark is at least one notch provided in a contour portion of the buffer, extending through the buffer from the first main surface to the second main surface.

According to a seventh aspect of the present invention, in the semiconductor device with identification function of the first, second, third or fourth aspect, the at least one mark is at least one hole extending through the semiconductor device from the first main surface to the second main surface.

According to an eighth aspect of the present invention, in the semiconductor device with identification function of the seventh aspect, the at least one hole can be arranged in a matrix consisting of a plurality of rows and columns.

According to a ninth aspect of the present invention, in the semiconductor device with identification function of the first, second, third or fourth aspect, the at least one mark is at least one groove provided on one of the first and second main surfaces and isolated from the other main surface.

According to a tenth aspect of the present invention, in the semiconductor device with identification function of the first, second, third or fourth aspect, the at least one mark is at least one printed line art.

According to an eleventh aspect of the present invention, in the semiconductor device with identification function of the first, second, third or fourth aspect, the at least one mark is at least one convex portion which protrudes to be higher than its vicinity.

According to a twelfth aspect of the present invention, in the semiconductor device with identification function of the first, second, third, fourth, fifth, sixth, seventh, ninth, tenth or eleventh, an end mark is given to indicate end portions of a region where the information is provided.

According to a thirteenth aspect of the present invention, in the semiconductor device with identification function of the twelfth, the end mark is a triangle notch provided in the contour portion.

According to a fourteenth aspect of the present invention, the semiconductor device with identification function, the type of which is identified by information corresponding to semiconductor elements integrated thereon, comprises: a first electrode; a second electrode; and a plurality of detection electrodes. In the semiconductor device with identification function of the fourteenth aspect, the first and second electrodes are supplied with first and second potentials which are different from each other and correspond to binary logic in mutually exclusive manner, the plurality of detection electrodes are selectively connected to either the first or second electrode according to the information, and the information is obtained by combination of potentials given by the plurality of detection electrodes.

According to a fifteenth aspect of the present invention, the semiconductor device with identification function comprises: a first main surface on which semiconductor elements are integrated; and a second main surface. The type of the semiconductor device is identified by information corresponding to the semiconductor elements. In semiconductor device with identification function of the fifteenth aspect, characters representing the information are given on the second main surface.

According to a sixteenth aspect of the present invention, in the semiconductor device with identification function, the type of which is identified by information corresponding to semiconductor elements integrated thereon and which is covered with a covering, the information is given on the covering.

In the semiconductor device with identification function of the first and second aspects, the two kinds of states of light reflection correspond to binary logic, and the type of semiconductor device is identified by a correspondence between the combination of the two kinds of states and the types of semiconductor device. Therefore, instead of printing a variety of characters on the semiconductor device, providing the combination of the two kinds of states on the semiconductor device or the buffer allows identification of the type of semiconductor device, thereby saving the time and labor for identification.

Moreover, there only needs means for irradiating the semiconductor device or the buffer with light and means for detecting the state of light reflection, and hence easy identification of the type of semiconductor device is achieved.

The semiconductor device with identification function of the second and sixteenth aspects allows identification of the type of semiconductor device using the buffer or covering. Since the semiconductor device is not direct processed, no restriction is imposed on area or position of the semiconductor device in forming the semiconductor elements. Moreover, the buffer or covering prevents impairment of the semiconductor device in conveyance.

The semiconductor device with identification function of the third and fourth aspects allows quick identification of the type of semiconductor device.

In the semiconductor device with identification function of the fifth, sixth, seventh, ninth, tenth and eleventh aspects, since the binary logic is obtained depending on the presence or absence of the notch, hole, groove, line art or convex portion, easy identification of the type of semiconductor device is achieved.

In the semiconductor device with identification function of the eighth aspect, the holes are arranged in a matrix for multi-bit representation of the type of semiconductor device, and hence the type of semiconductor device can be represented in a compact area. Accordingly, only the compact area of the semiconductor device has to be irradiated with light and detected, for example.

In the semiconductor device with identification function of the ninth, tenth and eleventh aspects particularly of the first aspect, and that of the fifteenth aspect, when the groove, line art, convex portion or character is formed on the second main surface, the first main surface on which the semiconductor elements are integrated is unaffected. Therefore, no restriction is imposed on area and position of the first main surface in forming the semiconductor elements. Moreover, the mark may be formed anywhere in the second main surface, and hence it is easy to meet the standardization as to where the mark is formed.

In the semiconductor device with identification function of the twelfth aspect, it is possible to recognize the ends of the information area by changing the size or shape of the notch, hole, groove, line art or convex portion. Therefore, quick identification of the type of semiconductor device is achieved.

In the semiconductor device with identification function of the thirteenth aspect, no restriction is imposed on the width of the cutter used for forming the end mark, and hence the time and labor for changing the cutter is saved.

In the semiconductor device with identification function of the fourteenth aspect, it is possible to form the electrodes and the connecting wires in the process of forming the semiconductor elements on the semiconductor device. Therefore, the process for identification is simplified and the semiconductor device of the present invention is easily provided.

An object of the present invention is to provide a semiconductor device with identification function which allows easy identification of its type.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

A semiconductor device of the first preferred embodiment has notches corresponding to binary logic in its contour portion, and the type of the semiconductor device is identified by the presence or absence of the notch.

Figure 1:
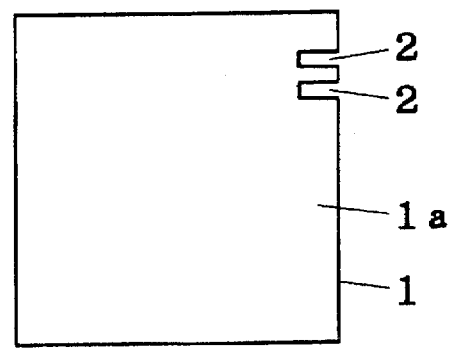
FIG. 1 is a plan view illustrating a construction in accordance with a first preferred embodiment of the present invention.

FIG. 1 is a plan view illustrating a construction of the bare chip 1 in accordance with the first preferred embodiment. The bare chip 1 is rectangular, and has a front surface 1a on the center portion of which semiconductor elements are integrated, and a back surface (not shown). The bare chip 1 is provided with notches 2 according to the type of the bare chip 1 on its side (the contour portion).

The notch 2 is oblong, extending through the bare chip 1 from the front surface 1a to the back surface. When the presence of the notches 2 is regarded as "1" and the absence of notch 2 as "0", the binary logic is obtained. Thus, one-bit information is given by a portion for one notch 2.

Figure 2:
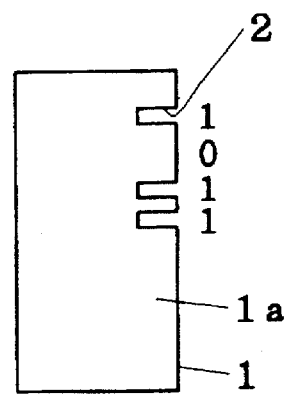
FIG. 2 is a schematic view showing an exemplary correspondence between the construction and a type name in accordance with the first preferred embodiment.
Figure 3:
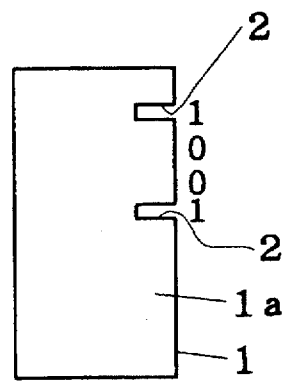
FIG. 3 is a schematic view showing another example of correspondence between the construction and the type name in accordance with the first preferred embodiment.

FIGS. 2 and 3 illustrate correspondence between the presence or absence of the notch 2 and the binary number "1" or "0". The presence or absence of the notches 2 indicates "1011" in FIG. 2 and "1001" in FIG. 3. The type name of the bare chip 1 is obtained by a correspondence between the binary number consisting of combination of numbers "0" and "1" and the type name of the bare chip 1. The number of portions for formation of the notch 2, i.e., the number of digits of the binary number are not limited to four.

Identification of the type name is performed, for example, as discussed below. The bare chip 1 is irradiated with light from above or below. Whether the light goes through the notch 2 or it is intercepted by the bare chip 1 is detected, and then the type name is recognized.

The notch 2 can be formed with laser beam or FIB (Focused Ion Beam) using $Ga^+$ (gallium ion) used in forming the bare chip 1 by wafer dicing. A cutter used for dicing may be also used to form the notch 2. Thus, the bare chip 1 of the first preferred embodiment can be provided without any special device.

The bare chip 1 of the first preferred embodiment is provided with the notches 2 in its contour portion, and allows easy identification of the type name of the bare chip 1 through irradiation with light and detection of the light. Furthermore, although the first preferred embodiment shows a case of forming the notches 2 on one side, the notches 2 may be formed on a plurality of sides of the bare chip 1 to attain the same effect as above.

The Second Preferred Embodiment

A semiconductor device of the second preferred embodiment has holes corresponding to binary logic, and the type of the semiconductor device is identified by the presence or absence of the hole.

Figure 4:
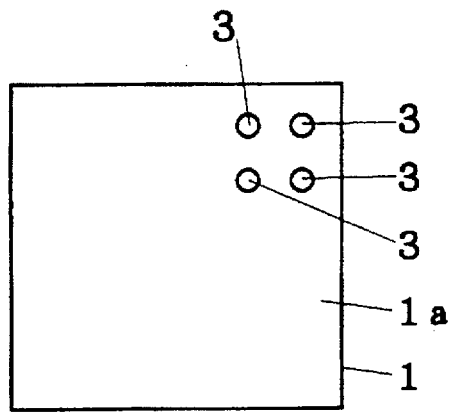
FIG. 4 is a plan view illustrating a construction in accordance with a second preferred embodiment of the present invention.

FIG. 4 is a plan view illustrating a construction of the bare chip 1 provided with holes 3 in its peripheral portion in accordance with the second preferred embodiment. Like the notch 2 of the first preferred embodiment, the hole 3 extends through the bare chip 1 from the front surface 1a to the back surface, and one-bit information is given according to the presence or absence of the hole 3. Accordingly, it is possible to identify the type name of the bare chip 1 by the holes The advantage of the hole 3 is as follows. The notches 2 of the first preferred embodiment are formed only in the contour portion of the bare chip 1. Therefore, the type name of the bare chip 1 is represented only in binary number. In contrast to this, the second preferred embodiment allows arrangement of the holes 3 in a matrix with N rows and M columns (N, M: any natural numbers), as shown in FIG. 4. For example, formation of the holes 3 on four columns, as shown in FIG. 5, permits representation of the type name in hexadecimal number.

Figure 5:
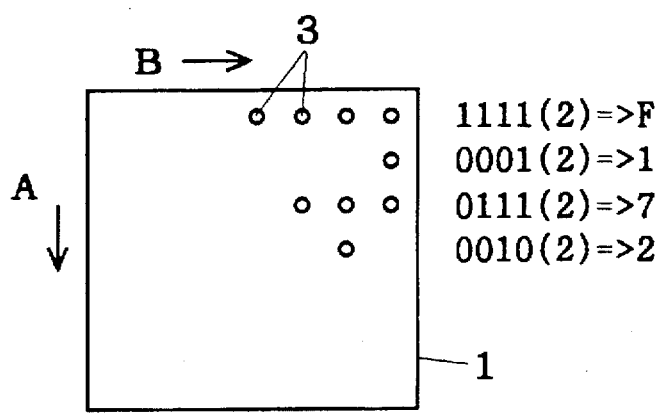
FIG. 5 is a schematic view showing an example of correspondence between the construction and the type name in accordance with the second preferred embodiment.

In FIG. 5, rows and columns are arranged in sequence along a direction A from upper side to lower side and a direction B perpendicular to A from left side to right side respectively. Each row corresponds in a unit to hexadecimal number. The holes 3 are formed on (1, 1), (1, 2), (1, 3), (1, 4), (2, 4), (3, 2), (3, 3), (3, 4), (4, 3) in FIG. 5, and hence the type name is recognized as "F172". Naturally, this preferred embodiment does not limit the representation of the type name to hexadecimal number and permits the representation of the type name in octal number and 32 number.

For a variety of types of bare chips, the first preferred embodiment needs several rows of notches 2. The second preferred embodiment has more information in one unit representing one number (corresponding to one row in the above example) than the first preferred embodiment. Accordingly, the area required to represent a certain amount of information is reduced and only a compact area has to be irradiated with light and detected.

The bare chip 1 of the first preferred embodiment has notches 2 in its contour portion. If some impact is applied to the bare chip 1, the contour portion is likely to break. In this case, it becomes impossible to recognize the type of the bare chip 1. In contrast, the second preferred embodiment allows a stable identification of the type of the bare chip 1 since the holes 3 are not formed in the contour portion.

The Third Preferred Embodiment

Figure 6:
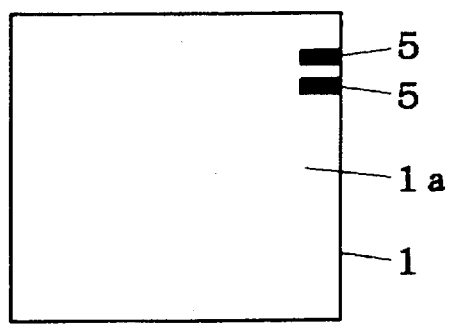
FIG. 6 is a plan view of an exemplary construction in accordance with a third preferred embodiment of the present invention.

FIG. 6 is a plan view illustrating a construction of the bare chip 1 in accordance with the third preferred embodiment. Lines 5 are printed on a peripheral portion of the front surface 1a of the bare chip 1 where the semiconductor elements are not integrated. When the bare chip 1 is irradiated with light, light on the line 5 and that on a portion without the line 5 have different reflectances. By detecting the difference in reflectance, one-bit information according to the presence or absence of line 5 can be obtained, like the notch of the first preferred embodiment.

Figure 7:
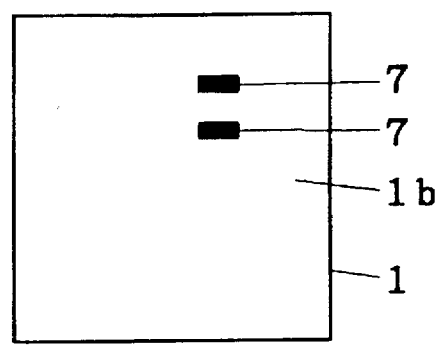
FIG. 7 is a plan view of another example of the construction in accordance with the third preferred embodiment of the present invention.

Naturally, like the lines 5, lines 7 are printed on the back surface of the bare chip 1. FIG. 7 is a plan view illustrating a construction of the bare chip 1 provided with the lines 7 which are printed on a back surface 1b. The lines 5 printed on the front surface 1a make it impossible to form the semiconductor elements on the same portion. The lines 7 printed on the back surface 1b imposes no restriction on where the semiconductor elements should be formed. Therefore, the bare chip 1 can be effectively used.

Furthermore, the lines 5 and 7 may be arranged in a matrix, like the holes 3 of the second preferred embodiment.

The Fourth Preferred Embodiment

Figure 8:
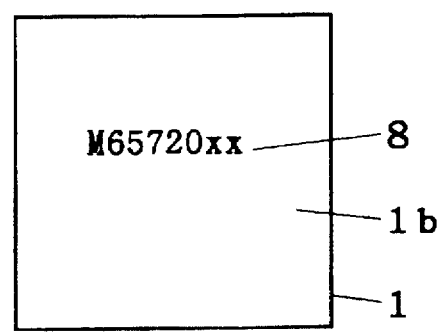
FIG. 8 is a plan view illustrating a construction in accordance with a fourth preferred embodiment of the present invention.

FIG. 8 is a plan view illustrating a construction of the bare chip 1 provided with the type name 8 itself which is printed on the back surface 1b. Since no semiconductor elements are formed on the back surface 1b, the type name 8 may be printed anywhere. Therefore, if a standard as to where the type name 8 should be given in the bare chip 1 will be established, it is possible to preferably meet the standard.

Furthermore, since the type name 8 itself is printed, the type of the bare chip 1 can be recognized by visual observation.

The Fifth Preferred Embodiment

When the information regarding the type name of the bare chip 1 is given on one side of the bare chip 1, quick identification of the type name of the bare chip 1 is achieved if the side can be immediately discriminated from other sides. The fifth preferred embodiment shows a construction of the bare chip 1 to indicate a region where the information is given.

Figure 9:
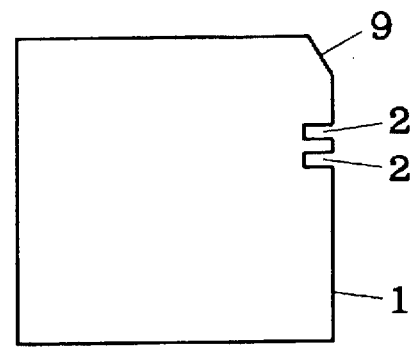
FIG. 9 is a plan view showing a first example of a construction in accordance with a fifth preferred embodiment of the present invention.

FIG. 9 is a plan view illustrating a construction of the bare chip 1 provided with a cut portion 9. A corner of the bare chip 1 is cut out to form the cut portion 9.

For example, it is determined that the corner in an upper end of the side where the notches 2 are formed in FIG. 9 is cut out to form the cut portion 9. When determined thus, the cut portion 9 indicates the side having the notches 2 of the first preferred embodiment and it is recognized that the side below the cut portion 9 gives the type name of the bare chip 1.

Figure 10:
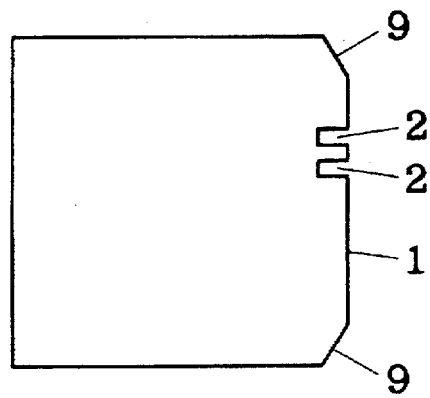
FIG. 10 is a plan view showing a second example of the construction in accordance with the fifth preferred embodiment of the present invention.
Figure 11:
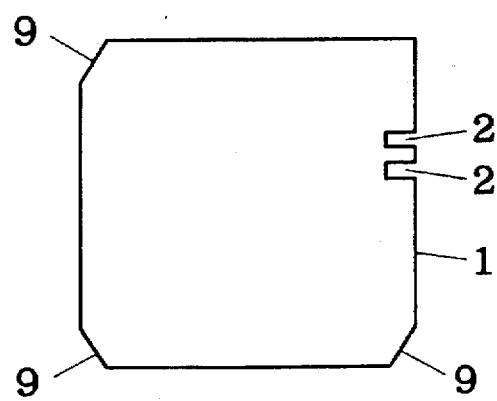
FIG. 11 is a plan view showing a third example of the construction in accordance with the fifth preferred embodiment of the present invention.

On the other hand, two cut portions 9 may be formed on both ends of the side having the notches 2 as shown in FIG. 10. Since the side between the cut portions 9 is unique, recognition error is avoided. Further, as shown in FIG. 11, a corner without the cut portion 9 may indicate the side having the notches 2. In FIG. 11, three corners have the cut portions 9 and the notches 2 are formed below the remaining one corner which has no cut portion 9.

The Sixth Preferred Embodiment

Figure 12:
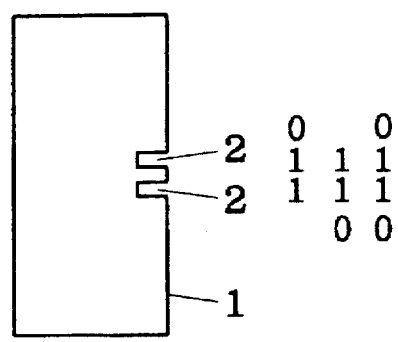
FIG. 12 is a schematic view showing an example of correspondence between the construction and the type name in accordance with the first preferred embodiment.

The type name of the bare chip 1 of the first preferred embodiment is identified by the presence or absence of notch 2. Therefore, there arises some ambiguity as to whether the information of the bare chip 1 of FIG. 12 is "011" or "110". Further, it may read "110", and thus there is another ambiguity as to how many bits the information has.

The sixth preferred embodiment shows a construction of the bare chip 1 provided with marks which clearly indicate ends of the region where the type name is given.

Figure 13:
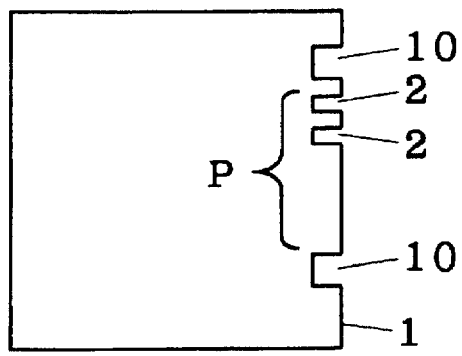
FIG. 13 is a plan view showing a first example of a construction in accordance with a sixth preferred embodiment of the present invention.

FIG. 13 is a plan view illustrating a construction of the bare chip 1 provided with notches 10. The bare chip 1 has an indicating portion P which gives the type name with the formed notches 2. The indicating portion P is located in the contour portion of the bare chip 1. The notches 10, which are oblong like the notch 2 and each have a width different from that of the notch 2, sandwich the both ends of the indicating portion P where the notches 2 are formed. In FIG. 13, the notch 10 is wider than the notch 2, and this allows discrimination between the notches 2 and 10. The notches 10 allow clear recognition of the indicating portion P.

With an increase in type of bare chips, there may arise a need for more bits to represent the type name. By forming the notches 10, it is possible to meet the need.

In the set of the notches 2, holes 3 or lines 5, by changing shape or size of one located at the ends of the set, the same effect as forming the notch 10 can be attained.

Figure 14:
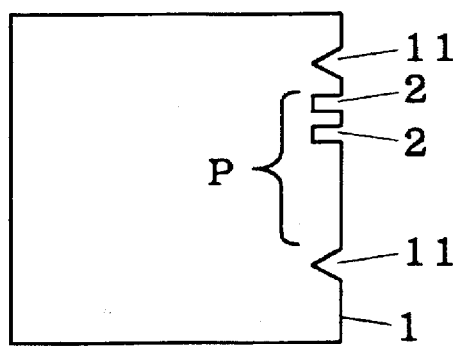
FIG. 14 is a plan view showing a second example of the construction in accordance with the sixth preferred embodiment of the present invention.

Instead of the notches 10, triangle notches 11 which are formed by cutting at an acute angle with respect to the contour line of the bare chip 1 may be used. FIG. 14 is a plan view illustrating a constitution of the bare chip 1 provided with the notches 11. The triangle notch 11 has an advantage of labor saving in formation. The reason will be discussed below.

To form the oblong notch 10 with a large width, a cutter having a width different from that of the cutter used in the notch 2 is needed. Or, using the same cutter as used for the notch 2, a repeat of cutting is made to form a notch with a large width. Accordingly, the process disadvantageously requires much time and labor.

In contrast, the triangle notch 11 can be formed by diagonally cutting with respect to a side from two points. Therefore, in forming the notch 11, it becomes possible to use the same cutter as used for the notch 2, and the time and labor needed for the process is saved.

Figure 15:
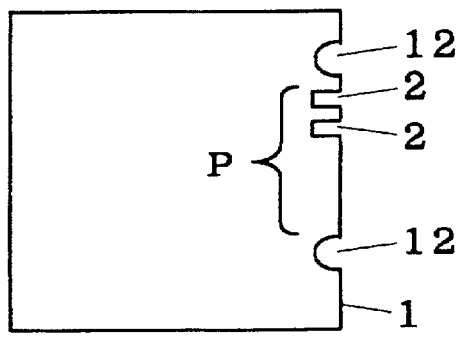
FIG. 15 is a plan view showing a third example of the construction in accordance with the sixth preferred embodiment of the present invention.

FIG. 15 is a plan view illustrating a constitution of the bare chip 1 provided with half-round notches 12. The notch 11 has a disadvantage that the vertex is likely to break. To avoid that, the half-round notch 12 is useful. The notch 12 can be formed by shaving the silicon forming the bare chip 1 with a file and the like.

The Seventh Preferred Embodiment

Figure 16:
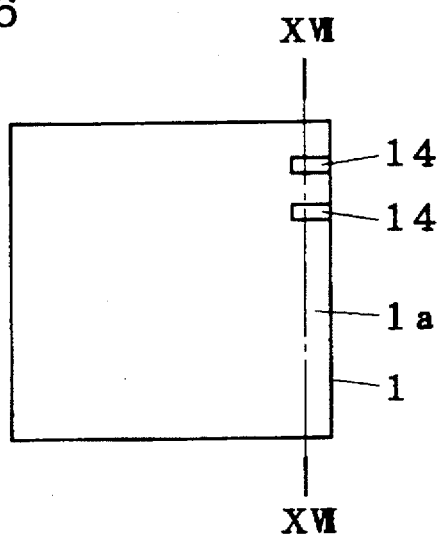
FIG. 16 is a plan view of an exemplary construction in accordance with a seventh preferred embodiment of the present invention.
Figure 17:
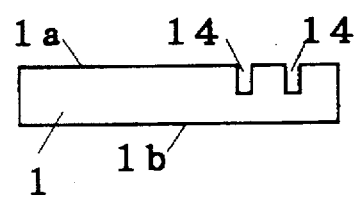
FIG. 17 is a cross section of FIG. 16 taken along the line XVII—XVII.

FIG. 16 is a plan view illustrating a constitution of the bare chip 1 provided with grooves 14 on its front surface 1a in accordance with the seventh preferred embodiment. FIG. 17 is a cross section of FIG. 16 taken along the line XVII—XVII. The groove 14 does not extend to the back surface, unlike the notch 2. Accordingly, the groove 14 can be easily formed by etching, and hence can be formed in the etching step of the process of forming the semiconductor elements on the bare chip 1. Thus, the groove 14 is formed more easily than the notch 2 of the first preferred embodiment.

For identification, the front surface 1a of the bare chip 1 is irradiated with light and a difference in reflex time between the groove 14 and a portion without the groove 14 is measured. Or, the depth of the groove may be measured with a measuring sensor to detect the presence or absence of the groove 14. The type name of the bare chip 1 is identified according to the presence or absence of the groove 14.

Figure 18:
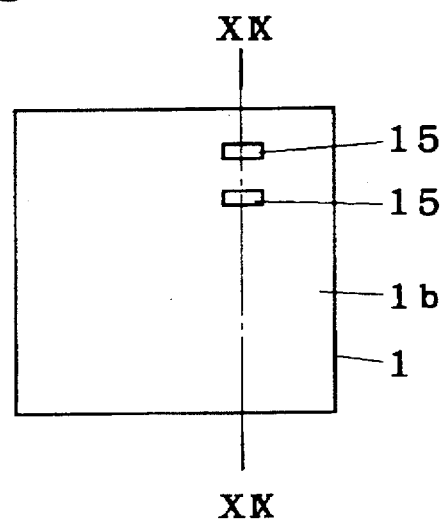
FIG. 18 is a plan view of another example of the construction in accordance with the seventh preferred embodiment of the present invention.
Figure 19:
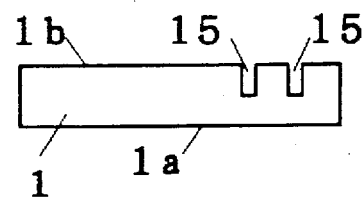
FIG. 19 is a cross section of FIG. 18 taken along the line XIX—XIX.

FIG. 18 is a plan view illustrating a constitution of the bare chip 1 provided with grooves 15 on its back surface 1b. FIG. 19 is a cross section of FIG. 18 taken along the line XIX—XIX. The groove 15 does not extend to the front surface 1a, like the groove 14. The second preferred embodiment has a restriction that the holes 3 should be formed avoiding contact with the semiconductor elements integrated on the front surface 1a since the holes 3 extend through the bare chip 1. In contrast, the groove 15 does not extend through the bare chip 1 and the semiconductor elements of a transistor and the like are not formed on the back surface 1b of the bare chip 1, and therefore the groove 15 can be formed anywhere in the back surface 1b.

The Eighth Preferred Embodiment

Figure 20:
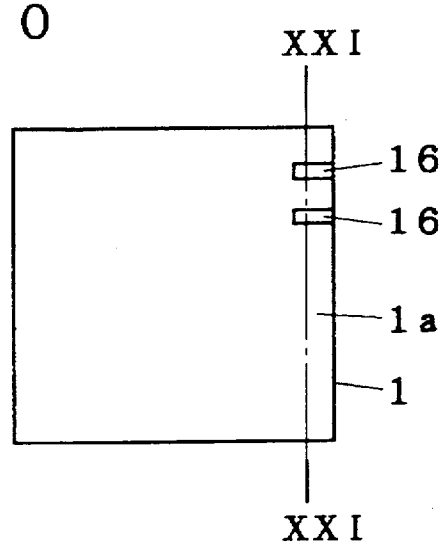
FIG. 20 is a plan view illustrating a construction in accordance with an eighth preferred embodiment of the present invention.
Figure 21:
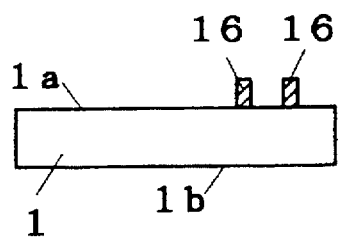
FIG. 21 is a cross section of FIG. 20 taken along the line XXI—XXI.

FIG. 20 is a plan view illustrating a constitution of the bare chip 1 in accordance with the eighth preferred embodiment. FIG. 21 is a cross section of FIG. 20 taken along the line XXI—XXI. The bare chip 1 of the eighth preferred embodiment has protrusions 16 which protrude so as to be higher than their vicinities, instead of the grooves 14 or 15 which recess so as to be lower than their vicinities, on its front surface 1a.

The protrusion 16 is detected in the same manner as the grooves 14 and 15, specifically, by measuring the difference in light reflex time between the protrusion 16 and a portion without the protrusion 16, or by measuring the height of the protrusion with the measuring sensor.

The protrusion 16 can be formed, for example, by printing an electrode made of solder and the like on the front surface 1a. The printing process is used in the TAB (Tape Automated Bonding) technique. Accordingly, the protrusion 16 can be formed in the process of forming the semiconductor elements. Thus, the constitution of this preferred embodiment is easily achieved.

The Ninth Preferred Embodiment

Figure 22:
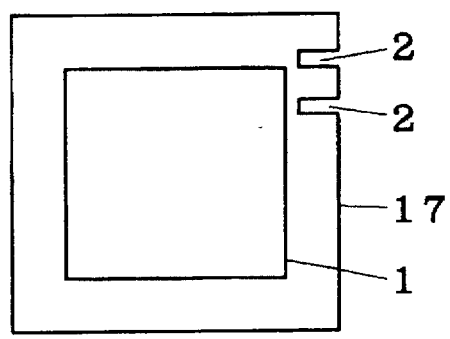
FIG. 22 is a plan view showing a first example of a construction in accordance with a ninth preferred embodiment of the present invention.

FIG. 22 is a plan view illustrating a constitution of the bare chip 1 in accordance with the ninth preferred embodiment. The bare chip 1 is surrounded by a resin 17 while the front surface 1a on which the semiconductor elements are integrated is exposed. On the resin 17, the notches 2 for identification of the type name are formed, like the first preferred embodiment.

Since the resin 17 is subjected to the process for identification of the bare chip 1, it is possible to prevent an impact from being applied direct to the bare chip 1 during the process for identification in the ninth preferred embodiment. Moreover, the resin 17 absorbs an impact to be applied to the bare chip 1 in conveyance and the like, and hence it is useful in protecting the bare chip 1.

Figure 23:
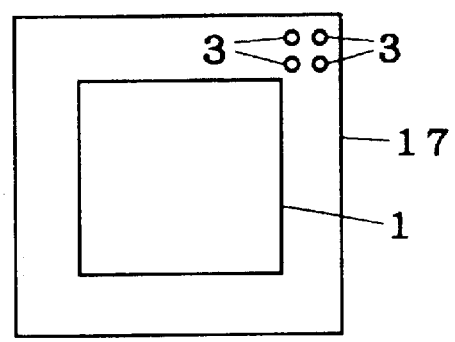
FIG. 23 is a plan view showing a second example of the construction in accordance with the ninth preferred embodiment of the present invention.
Figure 24:
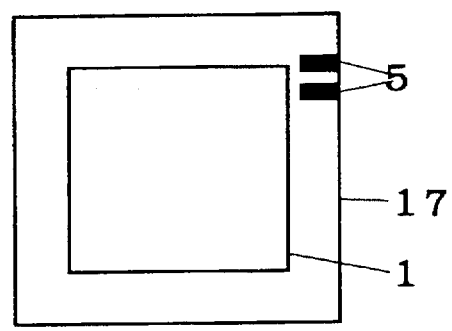
FIG. 24 is a plan view showing a third example of the construction in accordance with the ninth preferred embodiment of the present invention.
Figure 25:
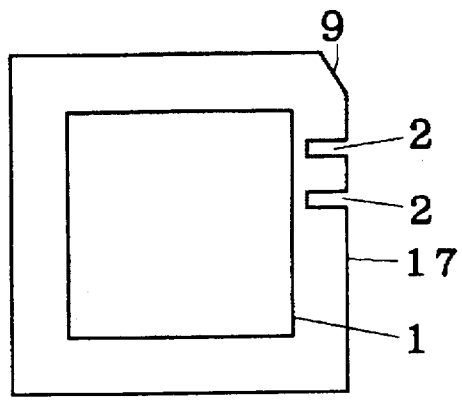
FIG. 25 is a plan view showing a fourth example of the construction in accordance with the ninth preferred embodiment of the present invention.
Figure 26:
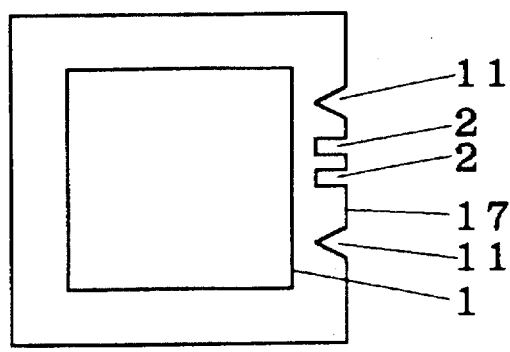
FIG. 26 is a plan view showing a fifth example of the construction in accordance with the ninth preferred embodiment of the present invention.
Figure 27:
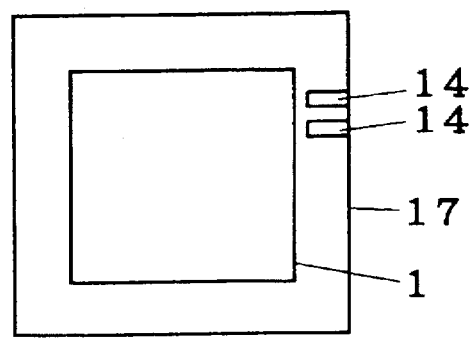
FIG. 27 is a plan view showing a sixth example of the construction in accordance with the ninth preferred embodiment of the present invention.
Figure 28:
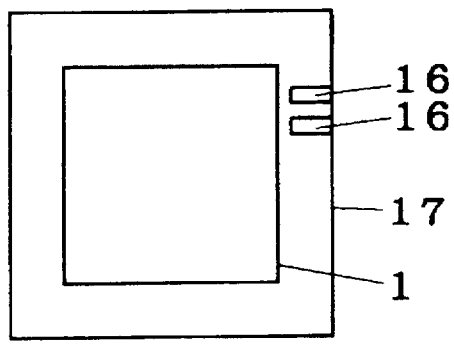
FIG. 28 is a plan view showing a seventh example of the construction in accordance with the ninth preferred embodiment of the present invention.

It is natural that the use of the resin 17 should be applied not only to the first preferred embodiment featuring the notches 2 but also to other preferred embodiments, for identification of the type name. FIG. 23 is a plan view of the resin 17 provided with the holes 3, FIG. 24 is a plan view of the resin 17 provided with the lines 5, FIG. 25 is a plan view of the resin 17 provided with the cutting portions 9, FIG. 26 is a plan view of the resin 17 provided with the notches 2 and 11, FIG. 27 is a plan view of the resin 17 provided with the grooves 14, and FIG. 28 is a plan view of the resin 17 provided with the protrusions 16.

The Tenth Preferred Embodiment

Figure 29:
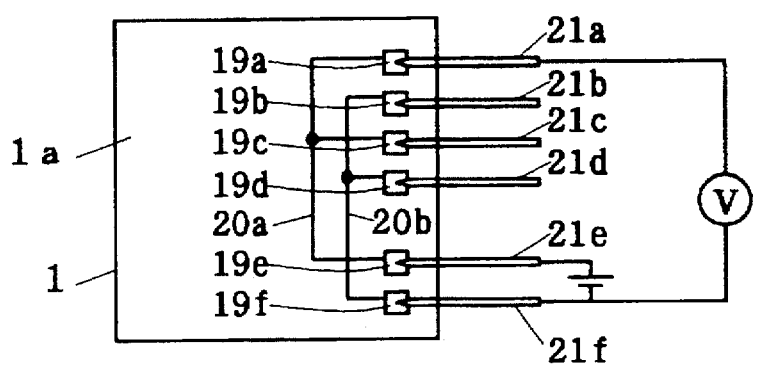
FIG. 29 is a plan view illustrating a construction in accordance with a tenth preferred embodiment of the present invention.

FIG. 29 is a plan view illustrating a construction of the bare chip 1 in accordance with the tenth preferred embodiment. On the front surface 1a of the bare chip 1 provided are detection electrode pads 19a to 19d and reference-potential electrode pads 19e and 19f. Identification of the type name of the bare chip 1 is achieved by selectively connecting the detection electrode pads 19a to 19d to either the reference-potential electrode pad 19e or 19f. This identification method will be discussed below.

In FIG. 29, the detection electrode pads 19a and 19c are connected to the reference-potential electrode pad 19e and the detection electrode pads 19b and 19d are connected to the reference-potential electrode pad 19f. The connection is established with aluminum wires 20a and 20b.

The reference-potential electrode pads 19e and 19f are supplied with potentials which are different from each other and correspond to binary logic by contacts 21e and 21f, respectively. For example, it is assumed herein that the reference-potential electrode pad 19e is supplied with a potential of "1" and the reference-potential electrode pad 19f is supplied with a potential of "0".

With the above connection, the detection electrode pads 19a and 19c take the potential of "1" and the detection electrode pads 19b and 19d take the potential of "0". When the potentials of the detection electrode pads 19a to 19d are detected by the contacts 21a to 21d, respectively, the information of "0101" is obtained.

By changing the connection using the aluminum wires 20a and 20b, any four-digit information, such as "0001" and "1001", can be obtained through the detection electrode pads 19a to 19d. In other words, by selectively connecting the detection electrode pads 19a to 19d to the reference-potential electrode pads 19e and 19f according to the type name of the bare chip 1, binary information regarding the type name can be achieved on the bare chip 1.

The detection electrode pads 19a to 19d, the reference-potential electrode pads 19e and 19f and the aluminum wires 20a and 20b are formed in the process of forming the semiconductor elements on the front surface 1a. Thus, there needs no special process to obtain this constitution, and hence easy identification of the type of bare chip 1 is achieved.

The number of detection electrode pads is not limited to four as above. It is desirable that an appropriate number of detection electrode pads may be formed on the bare chip 1 according to the number of types of bare chip 1.

Furthermore, this preferred embodiment is effectively applied to a wafer before division into bare chips 1.

The Eleventh Preferred Embodiment

Figure 30:
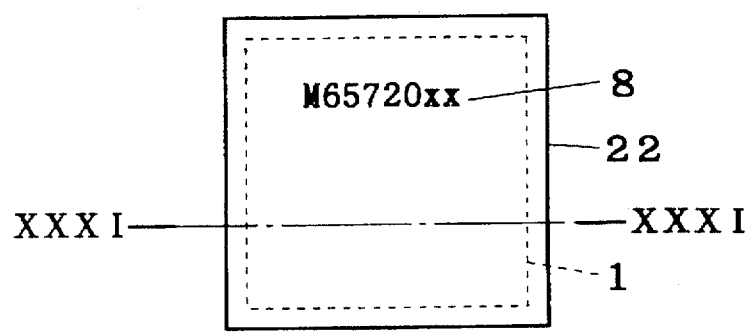
FIG. 30 is a plan view illustrating a construction in accordance with an eleventh preferred embodiment of the present invention.
Figure 31:
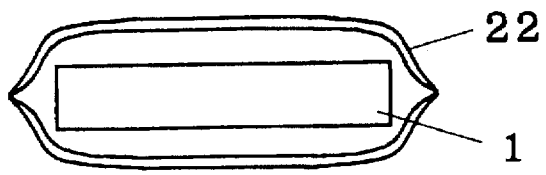
FIG. 31 is a cross section of FIG. 30 taken along the line XXXI—XXXI.

FIG. 30 is a plan view illustrating a constitution of a laminate 22 in accordance with the eleventh preferred embodiment. FIG. 31 is a cross section of FIG. 30 taken along the line XXXI—XXXI. The bare chip 1 is packed in the laminate 22 like a sack. On a surface of the laminate 22, the type name 8 indicating the type of bare chip 1 packed in the laminate 22 is printed.

In the eleventh preferred embodiment, the laminate 22, instead of the bare chip 1, is subjected to the process for identification of the type name. Therefore, it becomes possible to prevent an impact from being applied direct to the bare chip 1 during the process. Moreover, with the laminate 22, the bare chip 1 is protected from the impact in conveyance and the like. Furthermore, this preferred embodiment may be applied to the wafer.

The Twelfth Preferred Embodiment

Figure 32:
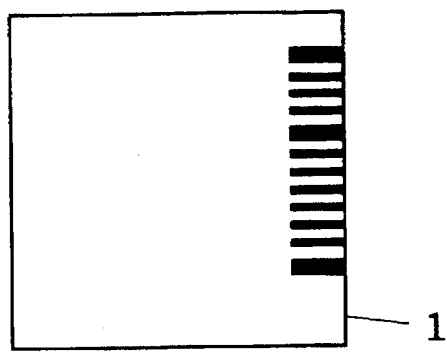
FIG. 32 is a plan view illustrating a construction in accordance with a twelfth preferred embodiment of the present invention.
Figure 33:
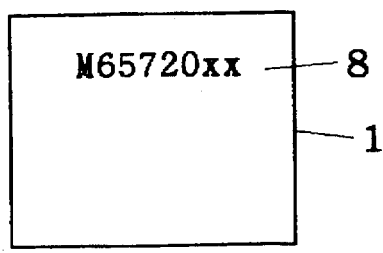
FIG. 33 is a plan view of a bare chip 1 in the background art.

FIG. 32 is a plan view illustrating a constitution of the bare chip 1 in accordance with the twelfth preferred embodiment. If the type name of the bare chip 1 can be expressed using a bar code, the notches 2 and the lines 5 as discussed earlier may be formed like the bar code. Specifically, the notches 2 and the lines 5 are formed so that their width and length may meet the standard of the bar code. The bar code may be printed on the laminate 22 of the eleventh preferred embodiment. In this preferred embodiment, utilizing the existing specification of bar code is such a convenience.

While the invention has been shown and described in detail, the foregoing description is in all aspects illustrative and not restrictive. It is therefore understood that numerous modifications and variations can be devised without departing from the scope of the invention.

We claim:

1. A semiconductor device with identification function, comprising:

a first main surface, on the center portion of which semiconductor elements are integrated; and a second main surface, said semiconductor device being formed by division of a semiconductor wafer, and the type of said semiconductor device being identified by information corresponding to said semiconductor elements, wherein at least one mark is selectively provided on a peripheral portion of at least one of said first main surface and said second main surface according to said information, said at least one mark makes a state of light reflection different from that on a portion without said mark when said semiconductor device is irradiated with light, to provide two kinds of states which are different from each other and correspond to binary logic, and said information is obtained by selective combination of said two kinds of states to form a binary encoded numeral representing said information.

2. The semiconductor device with identification function of claim 1, wherein said at least one mark is at least one printed line art.

* * * * *